(12) United States Patent
Hower et al.

(10) Patent No.: US 9,543,149 B2
(45) Date of Patent: Jan. 10, 2017

(54) HIGH VOLTAGE LATERAL EXTENDED DRAIN MOS TRANSISTOR WITH IMPROVED DRIFT LAYER CONTACT

(71) Applicant: Texas Instruments Incorporated, Dallas, TX (US)

(72) Inventors: Philip Leland Hower, Concord, MA (US); Sameer Pendharkar, Allen, TX (US); Marie Denison, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/567,398

(22) Filed: Dec. 11, 2014

(65) Prior Publication Data

US 2015/0171213 A1     Jun. 18, 2015

Related U.S. Application Data

(60) Provisional application No. 61/916,860, filed on Dec. 17, 2013.

(51) Int. Cl.
| | |
|---|---|
| *H01L 27/105* | (2006.01) |
| *H01L 29/66* | (2006.01) |
| *H01L 21/225* | (2006.01) |
| *H01L 21/266* | (2006.01) |
| *H01L 29/78* | (2006.01) |

(52) U.S. Cl.
CPC ......... *H01L 21/2253* (2013.01); *H01L 21/266* (2013.01); *H01L 29/66659* (2013.01); *H01L 29/7835* (2013.01)

(58) Field of Classification Search
USPC .................................. 257/337, 336; 438/286
See application file for complete search history.

(56) References Cited

U.S. PATENT DOCUMENTS

| | | | | |
|---|---|---|---|---|
| 6,498,376 B1* | 12/2002 | Miyagi | ............... | H01L 21/3226 257/391 |
| 2006/0003558 A1* | 1/2006 | Bang | ................. | H01L 21/26513 438/510 |
| 2011/0309440 A1* | 12/2011 | Hao | ................. | H01L 21/823412 257/337 |
| 2014/0021540 A1* | 1/2014 | Khayat | ................. | H01L 27/088 257/337 |

* cited by examiner

*Primary Examiner* — Zandra Smith
*Assistant Examiner* — Lawrence Tynes, Jr.
(74) *Attorney, Agent, or Firm* — Jacqueline J. Garner; Charles A. Brill; Frank D. Cimino

(57) ABSTRACT

An integrated circuit and method having an extended drain MOS transistor with a buried drift region, a drain end diffused link between the buried drift region and the drain contact, and a concurrently formed channel end diffused link between the buried drift region and the channel, where the channel end diffused link is formed by implanting through segmented areas to dilute the doping to less than two-thirds the doping in the drain end diffused link.

20 Claims, 7 Drawing Sheets

HIGH VOLTAGE LATERAL EXTENDED DRAIN MOS TRANSISTOR WITH IMPROVED DRIFT LAYER CONTACT

CROSS-REFERENCE TO RELATED APPLICATIONS

This application claims the benefit of priority under U.S.C. §119(e) of U.S. Provisional Application 61/916,860 filed Dec. 17, 2013, which is hereby incorporated by reference in its entirety.

FIELD OF THE INVENTION

This invention relates to the field of integrated circuits. More particularly, this invention relates to MOS transistors in integrated circuits.

BACKGROUND OF THE INVENTION

An integrated circuit may contain a planar extended drain metal oxide semiconductor (MOS) transistor with a buried drift region, for example to provide an operating voltage above the dielectric strength of the gate dielectric layer in the MOS transistor. It may be desirable to form a low resistance drain end connection between the buried drift region and the drain contact, while it may be desirable to form a lightly doped channel end link between the buried drift region and the channel of the MOS transistor. It may further be desirable to minimize the number of photolithographic and ion implant operations in the fabrication sequence of forming the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may include a planar extended drain MOS transistor with a buried drift region between the drain contact and the channel of the MOS transistor. A drain end link between the buried drift region and the drain contact is formed concurrently with a channel end link between the buried drift region and the channel. The drain end link and the channel end link are formed by ion implanting dopants followed by an anneal operation which diffuses the implanted dopants to make an electrical connection with the buried drift region. The average doping density in the channel end link is less than two-thirds the average doping density in the drain end link. The channel end link is formed by segmenting the ion implanted area so that the diffused dopant distributions of implanted segments in the channel end link are more diluted than in the drain end link after the anneal operation.

DETAILED DESCRIPTION OF EXAMPLE EMBODIMENTS

Figure 1A:
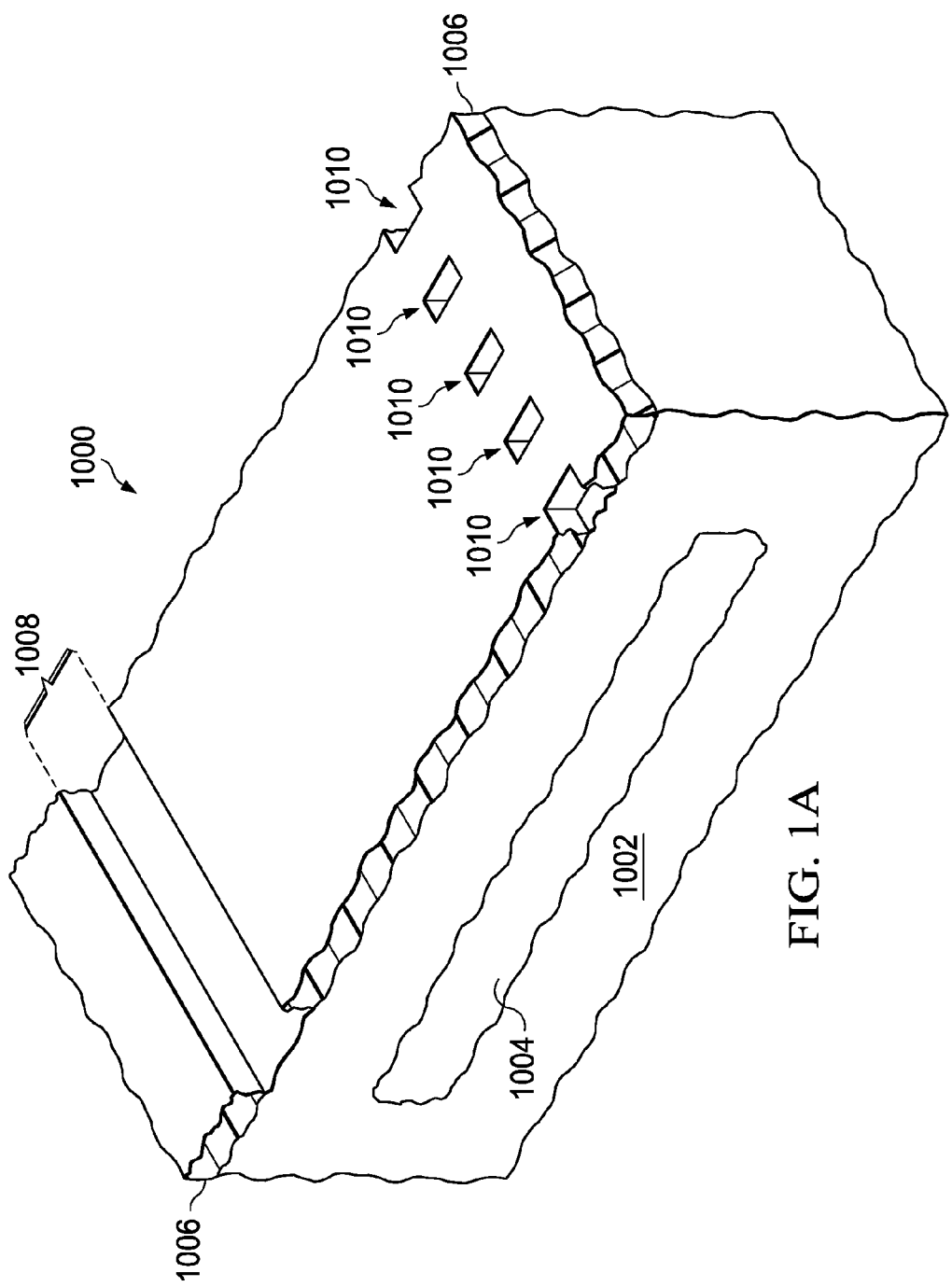
FIG. 1A through FIG. 1D are perspective views of an integrated circuit formed according to a first example, depicted in successive stages of fabrication.

The following co-pending patent application is related and hereby incorporated by reference: U.S. patent application Ser. No. 14/567,196 filed concurrently with this application.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include a planar extended drain MOS transistor with a buried drift region between a drain contact and a channel of the MOS transistor. A drain end link between the buried drift region and the drain contact is formed concurrently with a channel end link between the buried drift region and the channel, by ion implanting and annealing, which diffuses implanted dopants in each link to make electrical connections with the buried drift region. Ion implant areas in the channel end link are segmented so that dopants are diluted laterally during the anneal, to reduce an average doping density compared to a non-segmented implanted area. Distributions of dopants of adjacent implanted segments in the channel end link may overlap after the anneal operation. An average doping density in the channel end link is less than two-thirds the average doping density in the drain end link. The segmentation of the ion implanted area for the channel end link may be adjusted to provide a desired breakdown voltage and series resistance of the MOS transistor. A second planar extended drain MOS transistor with a buried drift region may be formed in the same integrated circuit with a different segmentation of an ion implanted area for its channel end link, formed concurrently with the channel end link of the first MOS transistor, providing an MOS transistor with a different desired breakdown voltage and series resistance with no additional process operations.

FIG. 1A through FIG. 1D are perspective views of an integrated circuit formed according to a first example, depicted in successive stages of fabrication. Referring to FIG. 1A, the integrated circuit 1000 is formed in and on a p-type substrate 1002, which may be a single crystal silicon wafer, a silicon-on-insulator (SOI) wafer, a hybrid orientation technology (HOT) wafer with regions of different crystal orientations, or other material appropriate for fabrication of the integrated circuit 1000. An n-type buried drift region 1004 of a planar extended drain n-channel MOS transistor is formed in the substrate 1002. The buried drift region 1004 may be formed by ion implanting n-type dopants, for example phosphorus, into an existing top surface of the substrate 1002 followed by growing p-type epitaxial semiconductor material over the implanted n-type dopants. In one version of the instant example, a top surface of the buried drift region 1004 may be between 2 and 4 microns deep in the substrate 1002. A region of the substrate 1002 above the buried drift region 1004 may provide a RESURF region during operation of the integrated circuit 1000.

A link ion implant mask 1006 is formed over an existing top surface of the substrate 1002. The link ion implant mask 1006 may include photoresist and/or a dielectric layer such as silicon dioxide. The link ion implant mask 1006 has a drain end open area 1008 over a drain end of the buried drift region 1004. The link ion implant mask 1006 also has a plurality of segmented channel end open areas 1010 over a channel end of the buried drift region 1004. In one version of the instant example, each segmented channel end open area 1010 may have lateral dimensions between 1.5 and 3.0 microns and be spaced between 4 and 7 microns apart.

Figure 1B:
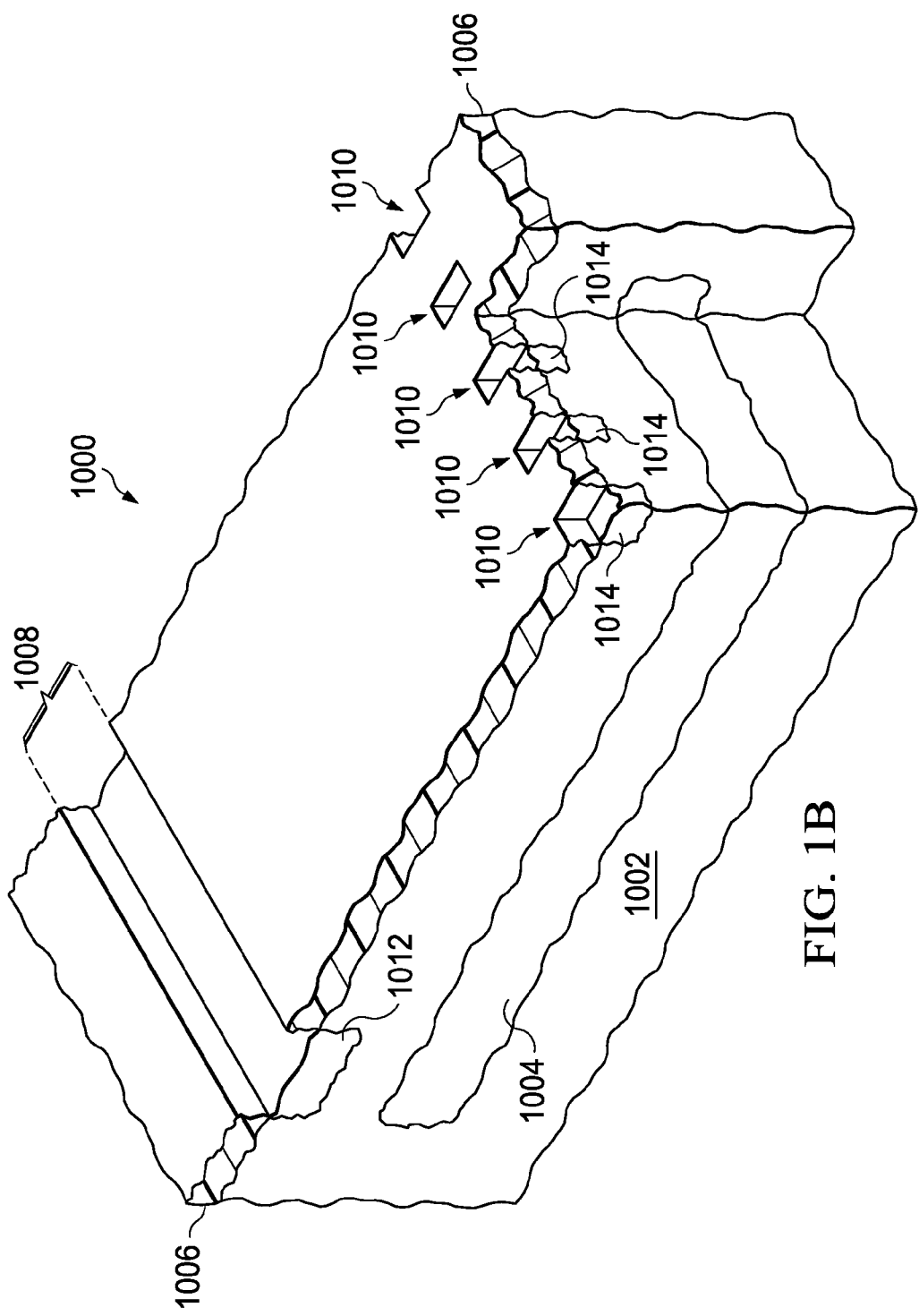

Referring to FIG. 1B, a link ion implant operation is performed on the integrated circuit 1000 which ion implants n-type dopants such as phosphorus and possibly arsenic through the drain end open area 1008 and the segmented channel end open areas 1010 of the link ion implant mask 1006, concurrently, into the substrate 1002. In one version of the instant example, the link ion implant operation may have a dose between $8 \times 10^{12}$ cm$^{-2}$ and $1.5 \times 10^{13}$ cm$^{-2}$. The link ion implant operation forms a drain end link implanted region 1012 under the drain end open area 1008, and a 1014 under the segmented channel end open areas 1010. In one version of the instant example, the channel end link implanted regions 1014 do not touch or overlap each other.

Figure 1C:
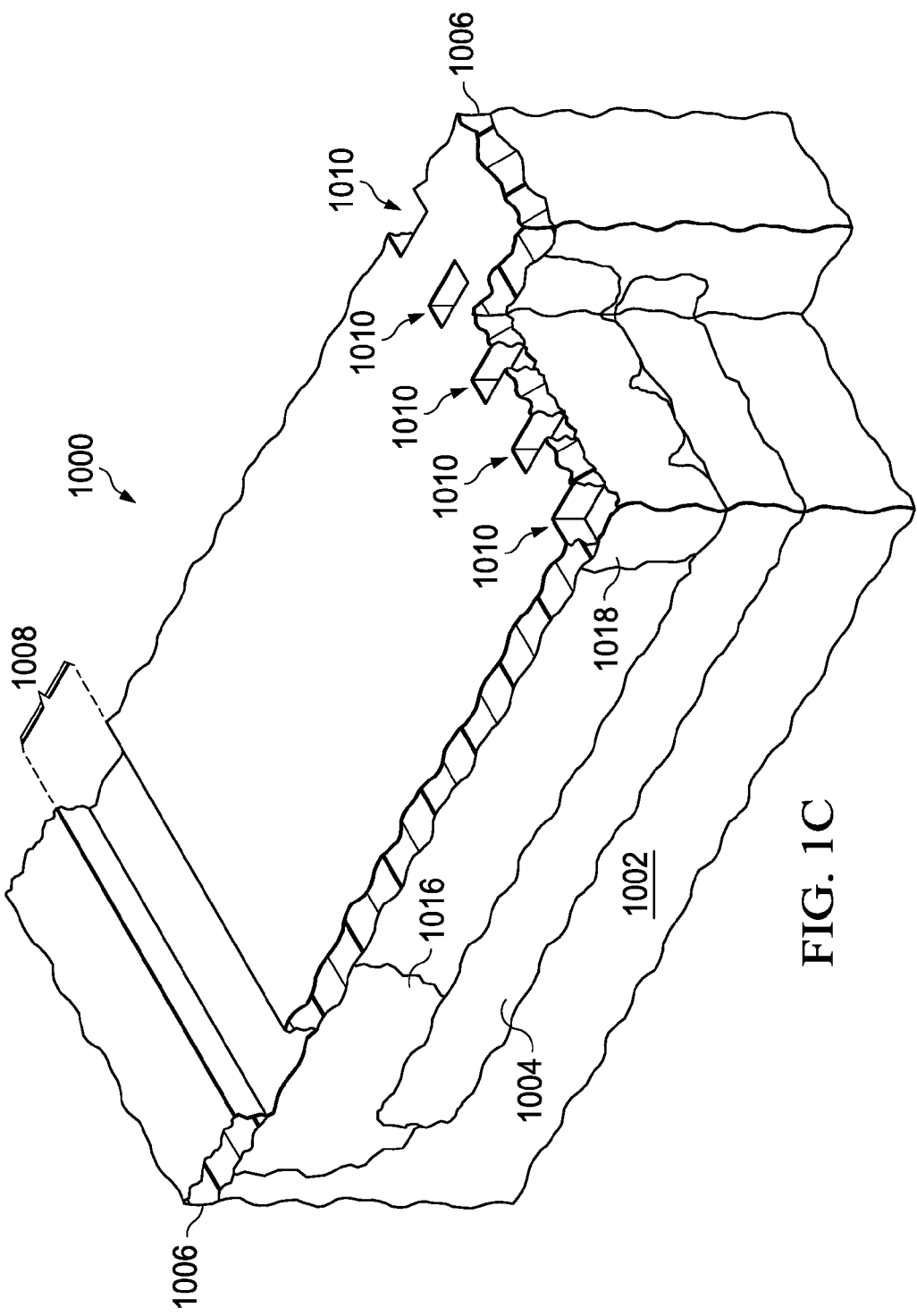

Referring to FIG. 1C, an anneal operation is performed on the integrated circuit 1000 which diffuses the dopants in the drain end link implanted region 1012 of FIG. 1B to form a drain end diffused link 1016 which extends to, and makes an electrical connection with, the buried drift region 1004. The anneal operation also diffuses the dopants in the channel end link implanted regions 1014 of FIG. 1B to form a channel end diffused link 1018 which extends to, and makes an electrical connection with, the buried drift region 1004. In one version of the instant example, diffused regions from adjacent channel end link implanted regions 1014 overlap to form a contiguous channel end diffused link 1018 as depicted in FIG. 1C. In an alternate version, gaps may exist between the diffused regions from adjacent channel end link implanted regions 1014. An average doping density in the channel end diffused link 1018 is less than two-thirds an average doping density in the drain end diffused link 1016. In one version of the instant example, the average doping density in the channel end diffused link 1018 may be between 25 percent and 33 percent of the average doping density in the drain end diffused link 1016. In one example, the average doping density in the drain end diffused link 1016 may be between $2.5 \times 10^{16}$ cm$^{-3}$ and $3.5 \times 10^{16}$ cm$^{-3}$, and the average doping density in the channel end diffused link 1018 may be between $5 \times 10^{15}$ cm$^{-3}$ and $1 \times 10^{16}$ cm$^{-3}$.

Figure 1D:
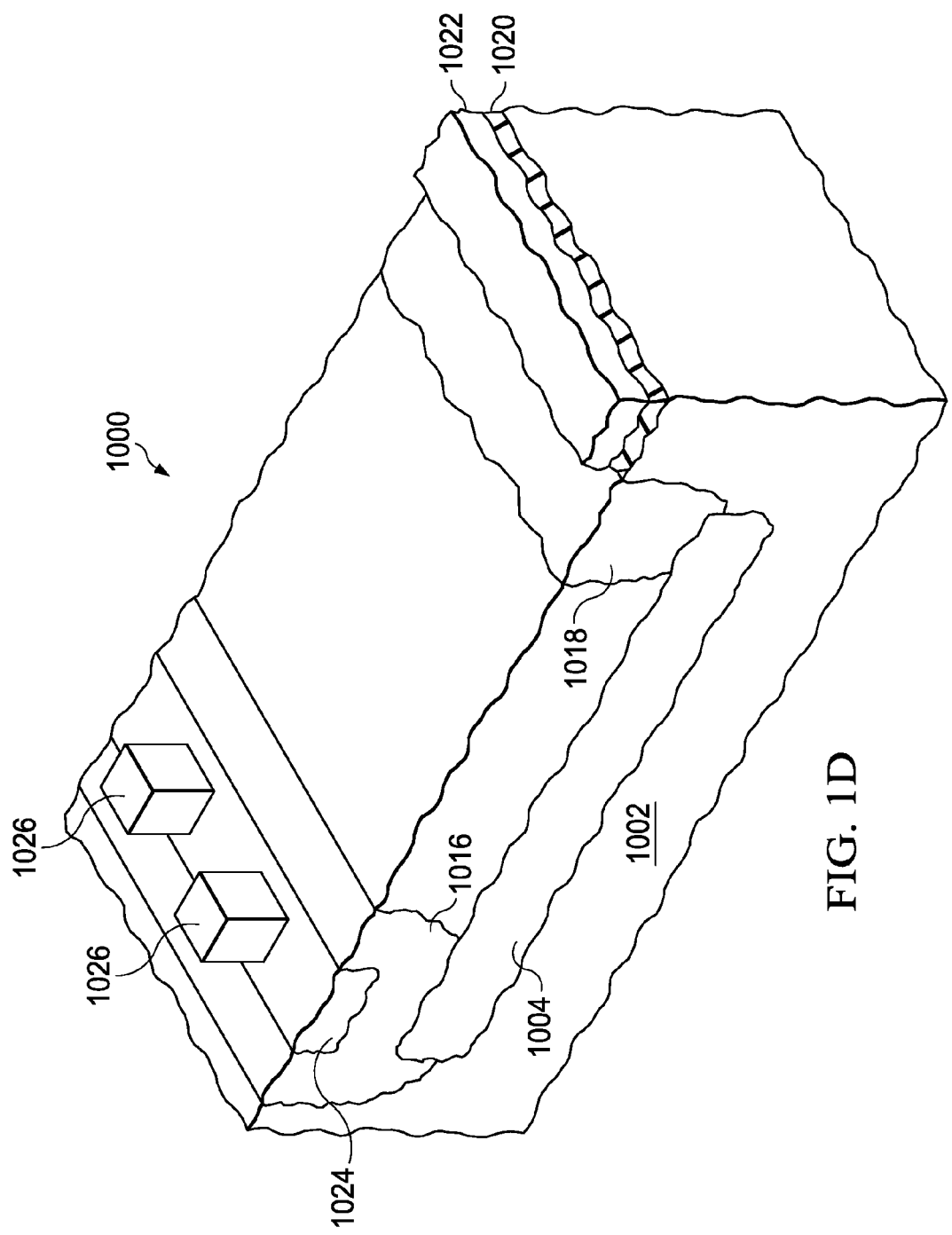

Referring to FIG. 1D, a gate dielectric layer 1020 of the MOS transistor is formed on the substrate 1002 adjacent to the channel end diffused link 1018 opposite the buried drift region 1004. A gate 1022 of the MOS transistor is formed on the gate dielectric layer 1020. An optional heavily doped drain diffused region 1024 may be formed in the drain end diffused link 1016 at the top surface of the substrate 1002. Drain contacts 1026 are formed on the substrate 1002 to make electrical connections to the drain end diffused link 1016, through the drain diffused region 1024 if formed. During operation of the integrated circuit 1000, the channel end diffused link 1018 provides an electrical connection from the buried drift region 1004 to a channel under the gate dielectric layer 1020. Lateral dimensions and spacing of the segmented channel end open areas 1010 of FIG. 1B may be adjusted to provide desired breakdown voltage and series resistance of the MOS transistor.

It will be recognized that a p-channel version of the MOS transistor described in reference to FIG. 1A through FIG. 1D may be formed with appropriate reversals of doping polarities. It will be recognized that a second planar extended drain MOS transistor with a buried drift region may be formed in the integrated circuit 1000, so that a channel end link of the second MOS transistor is formed concurrently with the channel end link 1018 of the first MOS transistor, with a different configuration of segmented channel end open areas, so as to provide breakdown and resistance values different from the first MOS transistor with no additional process operations.

Figure 2:
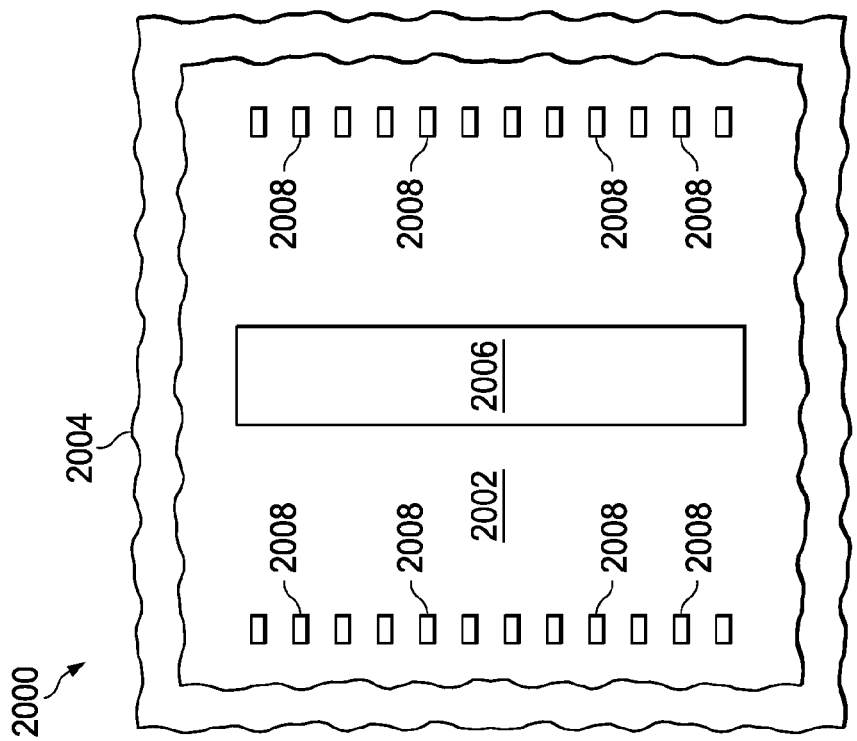
FIG. 2 is a top view of an integrated circuit containing a planar extended drain MOS transistor formed according to a second example, depicted after formation of a link ion implant mask.

FIG. 2 is a top view of an integrated circuit containing a planar extended drain MOS transistor formed according to a second example, depicted after formation of a link ion implant mask. The integrated circuit 2000 has the link ion implant mask 2002 formed over a substrate 2004 on which the integrated circuit 2000 is formed. The link ion implant mask 2002 has a linear drain end open area 2006 centrally located between two linear arrays of segmented channel end open areas 2008. After ion implantation using link ion implant mask 2002 and anneal as described above with reference to FIGS. 1B and 1C, a channel end diffused link is formed in the substrate below the segmented channel end open areas 2008 and a drain end diffused link is formed in the substrate below the linear drain end open area 2006.

Figure 3:
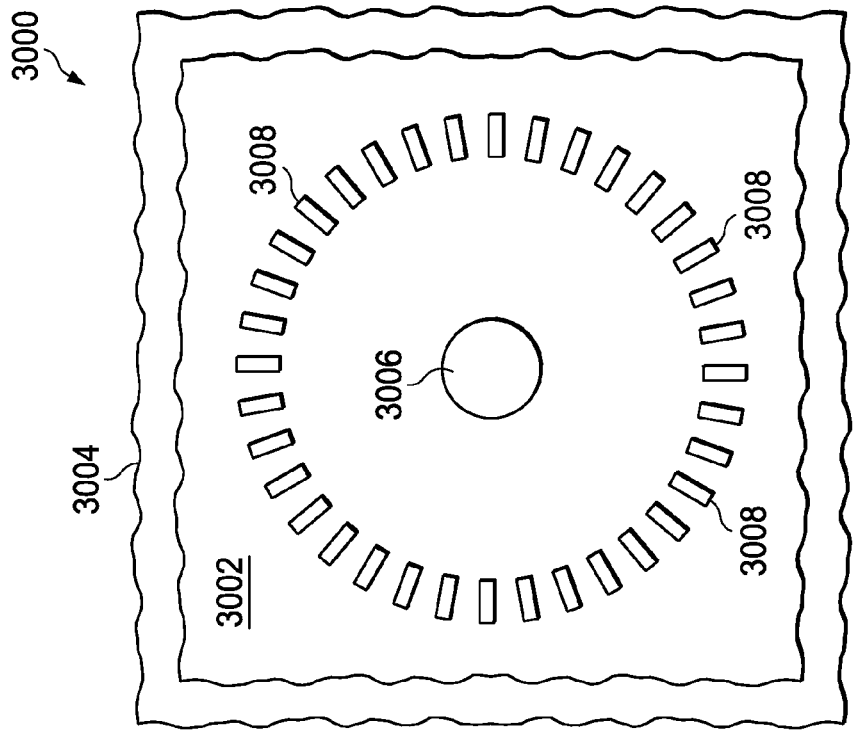
FIG. 3 is a top view of an integrated circuit containing a planar extended drain MOS transistor formed according to a third example, depicted after formation of a link ion implant mask.

FIG. 3 is a top view of an integrated circuit containing a planar extended drain MOS transistor formed according to a third example, depicted after formation of a link ion implant mask. The integrated circuit 3000 has the link ion implant mask 3002 formed over a substrate 3004 on which the integrated circuit 3000 is formed. The link ion implant mask 3002 has a circular drain end open area 3006 centrally located in a circular array of segmented channel end open areas 3008. After ion implantation using link ion implant mask 3002 and anneal as described above with reference to FIGS. 1B and 1C, a circular channel end diffused link is formed in the substrate below the circular array of segmented channel end open areas 3008 surrounding a drain end diffused link formed in the substrate below the circular drain end open area 3006.

Figure 4:
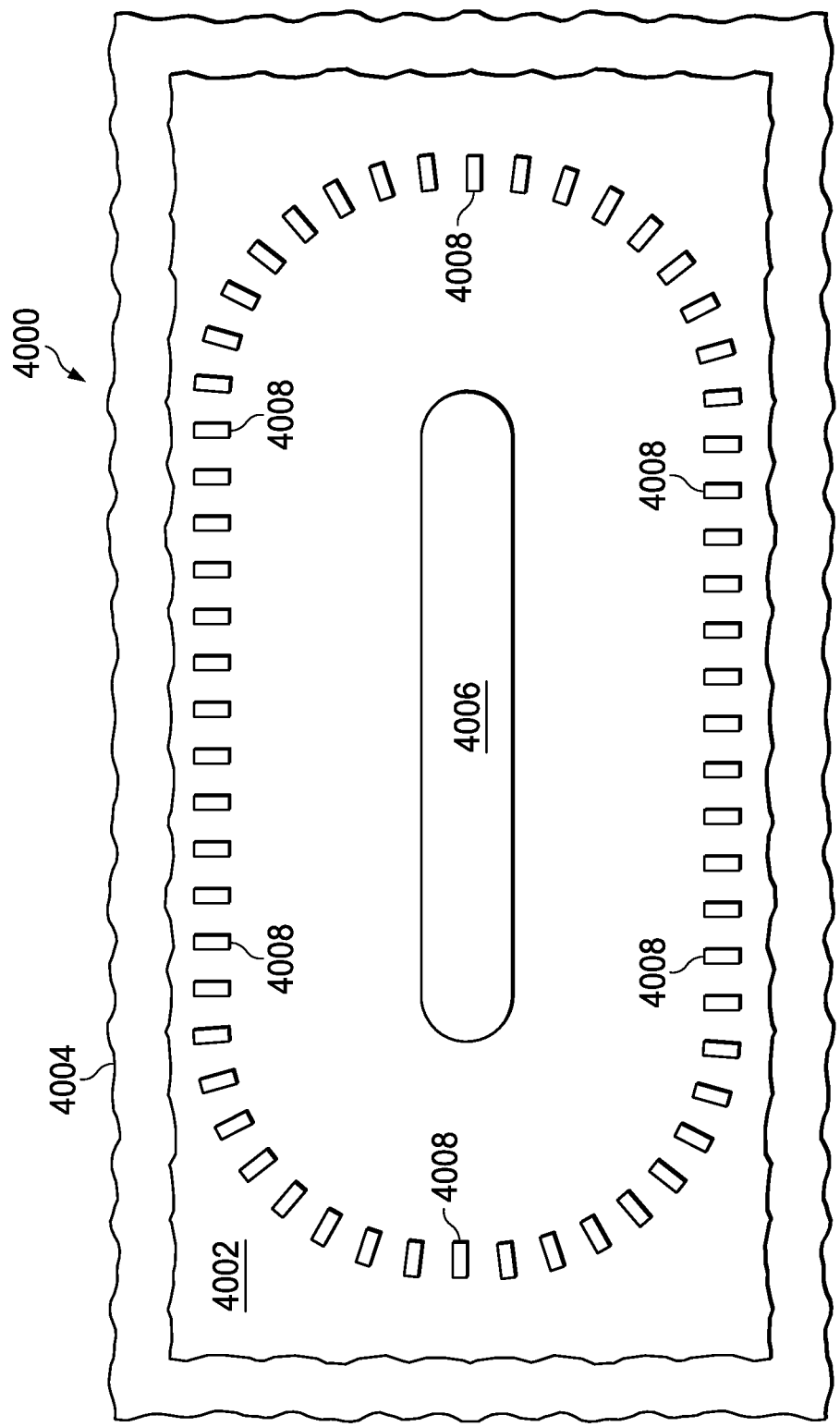
FIG. 4 is a top view of an integrated circuit containing a planar extended drain MOS transistor formed according to a fourth example, depicted after formation of a link ion implant mask.

FIG. 4 is a top view of an integrated circuit containing a planar extended drain MOS transistor formed according to a fourth example, depicted after formation of a link ion implant mask. The integrated circuit 4000 has the link ion implant mask 4002 formed over a substrate 4004 on which the integrated circuit 4000 is formed. The link ion implant mask 4002 has a linear drain end open area 4006 with rounded ends centrally located in a racetrack shaped array of segmented channel end open areas 4008. The channel end open areas 4008 are configured to provide a desired uniformity of electric field in a channel end link subsequently formed below the channel end open areas 4008. Forming the MOS transistor as depicted in FIG. 4 may consume less area of the integrated circuit 4000 than other configurations with comparable current capacities and breakdown voltages. After ion implantation using link ion implant mask 4002 and anneal as described above with reference to FIGS. 1B and 1C, a racetrack shaped channel end diffused link is formed in the substrate below the racetrack array of segmented channel end open areas 4008 surrounding a drain end diffused link formed in the substrate below the linear drain end open area 4006.

Figure 5:
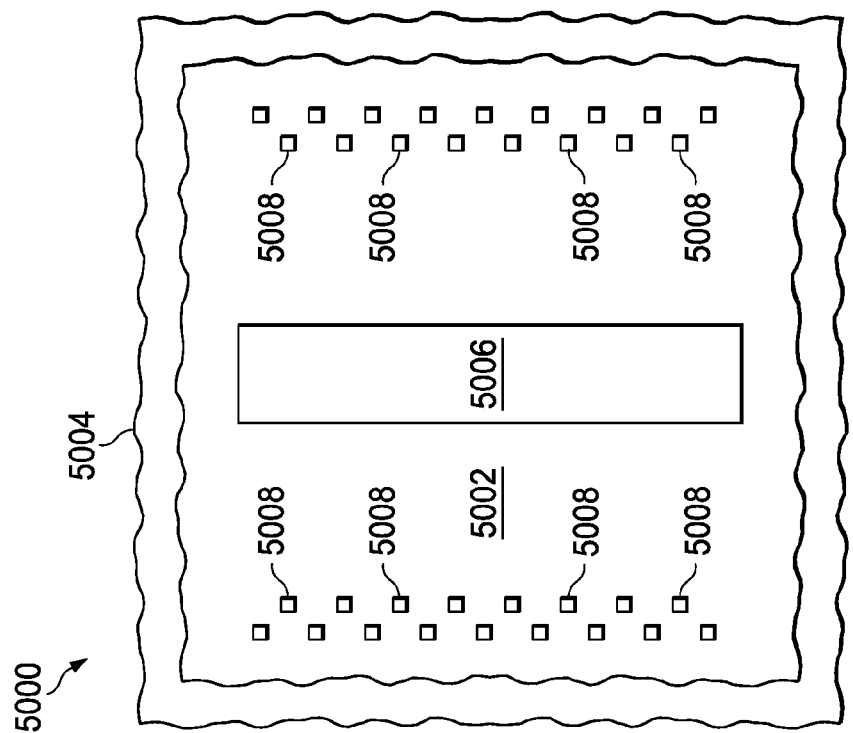
FIG. 5 is a top view of an integrated circuit containing a planar extended drain MOS transistor formed according to a fifth example, depicted after formation of a link ion implant mask.

FIG. 5 is a top view of an integrated circuit containing a planar extended drain MOS transistor formed according to a fifth example, depicted after formation of a link ion implant mask. The integrated circuit 5000 has the link ion implant mask 5002 formed over a substrate 5004 on which the integrated circuit 5000 is formed. The link ion implant mask 5002 has a drain end open area 5006 and segmented channel end open areas 5008. The segmented channel end open areas 5008 are disposed in a staggered configuration, for example to obtain a desired doping density and total width of a channel end link subsequently formed below the channel end open areas 5008. It will be recognized that a staggered configuration of segmented channel end open areas may be formed in an MOS transistor with a non-linear channel end link, such as a circular or racetrack shaped channel end link.

Figure 6:
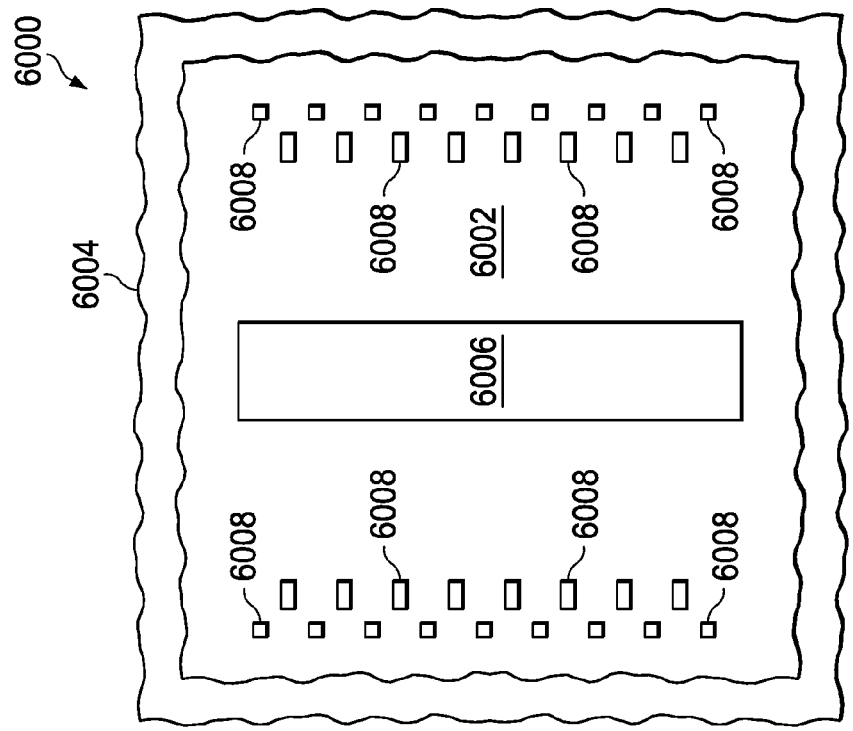
FIG. 6 is a top view of an integrated circuit containing a planar extended drain MOS transistor formed according to a sixth example, depicted after formation of a link ion implant mask.

FIG. 6 is a top view of an integrated circuit containing a planar extended drain MOS transistor formed according to a sixth example, depicted after formation of a link ion implant mask. The integrated circuit 6000 has the link ion implant mask 6002 formed over a substrate 6004 on which the integrated circuit 6000 is formed. The link ion implant mask 6002 has a drain end open area 6006 and segmented channel end open areas 6008. The segmented channel end open areas 6008 include open areas of at least two different sizes, for example to obtain a desired doping distribution adjacent to a channel of the MOS transistor and a desired resistance of a channel end link subsequently formed below the channel end open areas 6008. It will be recognized that a configuration of segmented channel end open areas with different sized openings may be formed in an MOS transistor with a non-linear channel end link, such as a circular or racetrack shaped channel end link.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. An integrated circuit, comprising:
   a substrate, said substrate having a first conductivity type;
   a planar extended drain metal oxide semiconductor (MOS) transistor, said MOS transistor including:
   a buried drift region in said substrate so that a top surface of said buried drift region is below a top surface of said substrate, said buried drift region having an opposite conductivity type from said substrate, said buried drift region having a drain end proximate to a drain contact of said MOS transistor, and having a channel end proximate to a channel area of said MOS transistor;
   a drain end diffused link in said substrate, said drain end link diffused having said conductivity type of said buried drift region, said drain end diffused link making an electrical connection to said buried drift region at said drain end of said buried drift region and making an electrical connection to said drain contact; and
   a channel end diffused link in said substrate, said channel end diffused link having said conductivity type of said buried drift region, said channel end diffused link making an electrical connection to said buried drift region at said channel end of said buried drift region, said channel end diffused link being formed by ion implantation through a plurality of segmented channel end open areas so that an average doping density in said channel end diffused link is less than two-thirds an average doping density in said drain end diffused link.

2. The integrated circuit of claim 1, in which said segmented channel end open areas are configured in a linear array.

3. The integrated circuit of claim 1, in which said segmented channel end open areas are configured in a circular array, and said drain end diffused link is centrally located in said circular array.

4. The integrated circuit of claim 1, in which said segmented channel end open areas are configured in a racetrack shaped array, and said drain end diffused link is centrally located in said racetrack shaped array.

5. The integrated circuit of claim 1, in which said segmented channel end open areas are arranged in a staggered configuration.

6. The integrated circuit of claim 1, in which:
   said conductivity type of said substrate is p-type;
   said conductivity type of said buried drift region is n-type;
   said conductivity type of said drain end diffused link is n-type; and
   said conductivity type of said channel end diffused link is n-type.

7. The integrated circuit of claim 1, in which said top surface of said buried drift region is between 2 and 4 microns deep in said substrate.

8. The integrated circuit of claim 1, in which said average doping density in said channel end diffused link is between 25 percent and 33 percent of said average doping density in said drain end diffused link.

9. The integrated circuit of claim 1, in which:
   said average doping density in said drain end diffused link is between $2.5 \times 10^{16}$ cm$^{-3}$ and $3.5 \times 10^{16}$ cm$^{-3}$; and
   said average doping density in said channel end diffused link is between $5 \times 10^{15}$ cm$^{-3}$ and $1 \times 10^{16}$ cm$^{-3}$.

10. The integrated circuit of claim 1, in which said segmented channel end open areas have lateral dimensions between 1.5 and 3.0 microns and are spaced between 4 and 7 microns apart.

11. A process of forming an integrated circuit, comprising:
providing a substrate, said substrate having a first conductivity type;
forming a planar extended drain MOS transistor, by a process including steps:
  forming a buried drift region in said substrate so that a top surface of said buried drift region is below a top surface of said substrate, so that said buried drift region has an opposite conductivity type from said substrate, so that said buried drift region has a drain end, and has a channel end;
  forming a link ion implant mask over a top surface of said substrate, so that said link ion implant mask has a drain end open area over said drain end of said buried drift region and has a plurality of segmented channel end open areas over said channel end of said buried drift region;
  ion implanting dopants through said drain end open area and said segmented channel end open areas concurrently into said substrate to form a drain end link implanted region under said drain end open area and to form a plurality of channel end link implanted regions under said plurality of segmented channel end open areas;
  performing an anneal operation which:
    diffuses said dopants in said drain end link implanted region to form a drain end diffused link which extends to, and makes an electrical connection with, said buried drift region; and
    diffuses said dopants in said channel end link implanted regions to form a channel end diffused link which extends to, and makes an electrical connection with, said buried drift region, so that an average doping density in said channel end diffused link is less than two-thirds an average doping density in said drain end diffused link;
  forming a gate dielectric layer on said substrate adjacent to said channel end diffused link opposite said buried drift region;
  forming a gate on said gate dielectric layer; and
  forming a drain contact on said substrate so as to make an electrical connection to said drain end diffused link.

12. The process of claim 11, in which said segmented channel end open areas are configured in a linear array.

13. The process of claim 11, in which said segmented channel end open areas are configured in a circular array, and said drain end diffused link is centrally located in said circular array.

14. The process of claim 11, in which said segmented channel end open areas are configured in a racetrack shaped array, and said drain end diffused link is centrally located in said racetrack shaped array.

15. The process of claim 11, in which said segmented channel end open areas are arranged in a staggered configuration.

16. The process of claim 11, in which:
said conductivity type of said substrate is p-type;
said conductivity type of said buried drift region is n-type;
said conductivity type of said drain end diffused link is n-type; and
said conductivity type of said channel end diffused link is n-type.

17. The process of claim 11, in which said top surface of said buried drift region is between 2 and 4 microns deep in said substrate.

18. The process of claim 11, in which said average doping density in said channel end diffused link is between 25 percent and 33 percent of said average doping density in said drain end diffused link.

19. The process of claim 11, in which:
said average doping density in said drain end diffused link is between $2.5 \times 10^{16}$ cm$^{-3}$ and $3.5 \times 10^{16}$ cm$^{-3}$; and
said average doping density in said channel end diffused link is between $5 \times 10^{15}$ cm$^{-3}$ and $1 \times 10^{16}$ cm$^{-3}$.

20. The process of claim 11, in which said segmented channel end open areas have lateral dimensions between 1.5 and 3.0 microns and are spaced between 4 and 7 microns apart.

* * * * *